United States Patent
Woo et al.

(10) Patent No.: US 12,106,996 B2
(45) Date of Patent: Oct. 1, 2024

(54) COLLET STRUCTURE AND SEMICONDUCTOR FABRICATING APPARATUS INCLUDING THE SAME

(71) Applicant: SK hynix Inc., Gyeonggi-do (KR)

(72) Inventors: Jung Bum Woo, Gyeonggi-do (KR); Soo Hyuk Kim, Gyeonggi-do (KR); Byeong Ho Lee, Gyeonggi-do (KR); Tae Hwan Lim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 690 days.

(21) Appl. No.: 17/242,996

(22) Filed: Apr. 28, 2021

(65) Prior Publication Data

US 2022/0115256 A1    Apr. 14, 2022

(30) Foreign Application Priority Data

Oct. 8, 2020   (KR) .................... 10-2020-0130330

(51) Int. Cl.
*H01L 21/683*  (2006.01)
*H01L 21/67*  (2006.01)
(52) U.S. Cl.
CPC .... *H01L 21/6838* (2013.01); *H01L 21/67144* (2013.01)
(58) Field of Classification Search
CPC ........... H01L 21/6838; H01L 21/67144; H01L 21/67721; H05K 13/0404
See application file for complete search history.

(56) References Cited

FOREIGN PATENT DOCUMENTS

| KR | 101385443 B1 | * | 4/2014 | |
| KR | 101542819 B1 | * | 6/2015 | |
| KR | 20170100838 A | * | 9/2017 | |
| KR | 10-2037948 B1 | | 10/2019 | |
| KR | 20200018024 A | * | 2/2020 | |
| TW | 201533878 A | * | 9/2015 | ....... H01L 21/67121 |

* cited by examiner

*Primary Examiner* — Sunil K Singh
*Assistant Examiner* — Eric Daniel Whitmire
(74) *Attorney, Agent, or Firm* — IP & T GROUP LLP

(57) ABSTRACT

A semiconductor fabricating apparatus may include a collet structure configured to pick-up a semiconductor chip. The collet structure may include a holder, a plate, an absorption member and an edge contact. The holder may be configured to downwardly receive vacuum. The holder may include a magnet arranged in the holder. The plate may include an upper surface magnetically and mechanically combined with the holder. The plate may include a sidewall wholly exposed by the holder. The plate may receive the vacuum from the holder. The absorption member may make contact with the plate to pick-up the semiconductor chip using the vacuum received from the plate. The edge contact may include a protrusion having a first length protruded from an edge portion of a bottom surface of the holder to make contact with the plate.

12 Claims, 17 Drawing Sheets

COLLET STRUCTURE AND SEMICONDUCTOR FABRICATING APPARATUS INCLUDING THE SAME

CROSS-REFERENCES TO RELATED APPLICATION

The present application claims priority under 35 U.S.C. § 119(a) to Korean application number 10-2020-0130330, filed on Oct. 8, 2020, which is incorporated herein by reference in its entirety.

BACKGROUND

1. Technical Field

Various embodiments of the present invention generally relate to a semiconductor fabricating system and, more particularly, to a collet structure for a pick-up of a semiconductor chip. Various embodiments of the present invention relate also to a semiconductor fabricating apparatus including the collet structure.

2. Related Art

Generally, semiconductor devices may be integrated on a semiconductor substrate by repeatedly performing a series of semiconductor fabrication processes. The semiconductor substrate (i.e., semiconductor wafer) may include a plurality of semiconductor chips or semiconductor dies. After completing the semiconductor fabricating processes, the semiconductor substrate may be singulated into the semiconductor chips. The process for singulating the semiconductor chips may be referred to as a dicing process. The singulated semiconductor chips may be bonded to a package substrate.

The semiconductor chips separated from the semiconductor substrate may be picked up by a collet of a transferring apparatus or a die bonding apparatus. The semiconductor chips picked up by the collet may be transferred to the package substrate.

The collet may include a plurality of parts. It may be required to periodically exchange the parts for new parts. Thus, a collet having a simple structure may be required. Further, because the collet may pick up the semiconductor chips one-by-one, interference between the semiconductor chip picked up by the collet and an adjacent semiconductor chip or other parts may be generated. In order to prevent a collision between the semiconductor chip picked up by the collet and the adjacent semiconductor chip or the adjacent parts, a collet having a simple structure may be required.

SUMMARY

In various embodiments of the present disclosure, a semiconductor fabricating apparatus is provided including a collet structure configured to pick-up a semiconductor chip. The collet structure may include a holder, a plate, an absorption member and an edge contact. The holder may be configured to downwardly receive vacuum. The holder may include a magnet arranged in the holder. The plate may include an upper surface magnetically and mechanically combined with the holder. The plate may include a sidewall wholly exposed by the holder. The plate may receive the vacuum from the holder. The absorption member may make contact with the plate to pick-up the semiconductor chip using the vacuum received from the plate. The edge contact may include a protrusion having a first length protruded from an edge portion of a bottom surface of the holder to make contact with the plate.

In various embodiments of the present disclosure, the plate may include a first vacuum hole and a second vacuum hole connected to the first vacuum hole. The second vacuum hole may include a center hole, a line hole and a connection hole. The center hole may be formed at the upper surface of the plate to receive an alignment block extended from a shank. The line hole may be formed at an edge portion of the plate. The connection hole may be connected between the center hole and the line hole.

In various embodiments of the present disclosure, the absorption member may include a recess formed at a lower corner of a bottom surface of the absorption member to define a contact region at the bottom surface of the absorption member. The contact region of the absorption member may be absorbed onto the semiconductor chip. The edge portion of the bottom surface of the absorption member may have a thickness thinner than a thickness a central region of the absorption member. The absorption member may include a third vacuum hole connected to the second vacuum hole formed at the plate.

In various embodiments of the present disclosure, a collet structure may include a holder, a plate and an absorption member. The plate may be magnetically and mechanically combined with the holder. The absorption member may make contact with the plate. The holder may have a size substantially the same as a size of the plate. The holder may have a sidewall substantially coplanar with a sidewall of the plate.

In various embodiments of the present disclosure, a collet structure for a semiconductor manufacturing apparatus, the collet structurer may comprise a holder and a plate. The holder includes a first vacuum hole passing through a central section of the holder, and a magnetic shank surrounding the holder. The plate is configured to be coupled with the holder. The plate includes a second vacuum hole in fluid communication with the first vacuum hole when the plate is coupled to the holder for transferring a vacuum to an absorption member to hold the absorption member attached to the plate. The holder has an alignment block for aligning the holder with the plate. The plate is coupled to the holder magnetically via a magnetic force exerted by the magnetic shank.

According to embodiments of the present disclosure, the shank and a vacuum provider in the holder of the collet structure may be integrally formed with each other to omit an additional process for combining the vacuum provider with the shank. Further, the size of the holder may be substantially equal to or less than the size of the plate. Thus, the holder may make contact with the plates having various sizes to pick-up the semiconductor chips having various sizes. Furthermore, the semiconductor chip picked-up by the holder having the small size may not make contact with adjacent other semiconductor chips and/or parts. As a result, efficiency of a pick-up process, productivity of the semiconductor chip, etc., may be improved and a process error may also be prevented.

BRIEF DESCRIPTION OF THE DRAWINGS

The above and another aspects, features and advantages of the subject matter of the present disclosure will be more clearly understood from the following detailed description taken in conjunction with the accompanying drawings, in which.

DETAILED DESCRIPTION

Various embodiments of the present invention will be described in greater detail with reference to the accompanying drawings. The drawings are schematic illustrations of various embodiments and intermediate structures. As such, variations from the configurations and shapes of the illustrations as a result, for example, of manufacturing techniques and/or tolerances, are to be expected. Thus, the described embodiments should not be construed as being limited to the particular configurations and shapes illustrated herein but may include deviations in configurations and shapes which do not depart from the spirit and scope of the present invention as defined in the appended claims.

The present invention is described herein with reference to cross-section and/or plan illustrations of embodiments of the present invention. However, embodiments of the present invention should not be construed as limiting the inventive concept. Although a few embodiments of the present invention will be shown and described, it will be appreciated by those of ordinary skill in the art that changes may be made in these embodiments without departing from the principles and spirit of the present invention.

Hereinafter, terms such as a semiconductor wafer, a wafer, a substrate, a wafer substrate, a partially fabricated integrated circuit, etc., may be interchangeably used with each other. However, the substrate may indicate the semiconductor wafer, a chamber component processed in different reaction chamber, or a package substrate. A person skilled in the art may understand the partially fabricated integrated circuit as a silicon wafer during an arbitrary process among semiconductor fabricating processes.

Figure 1:
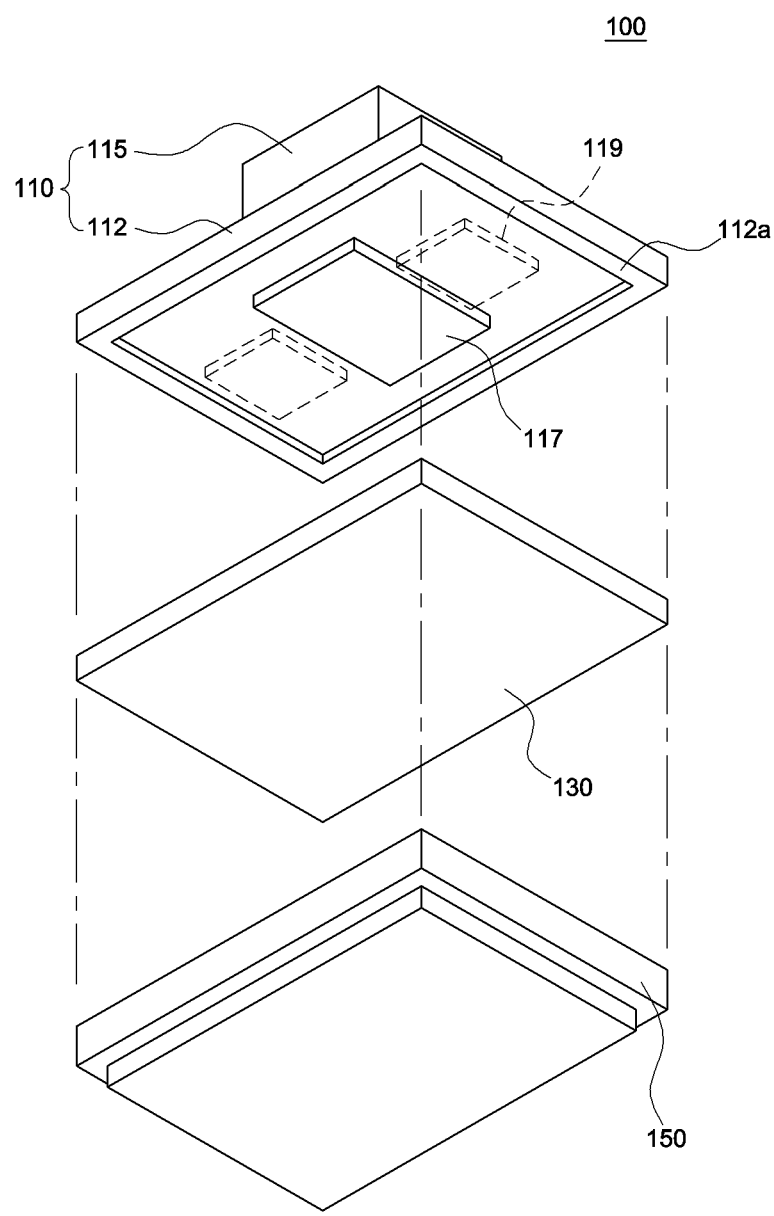
FIG. 1 is an exploded perspective view illustrating a collet structure in accordance with an embodiment of the present disclosure.
Figure 2:
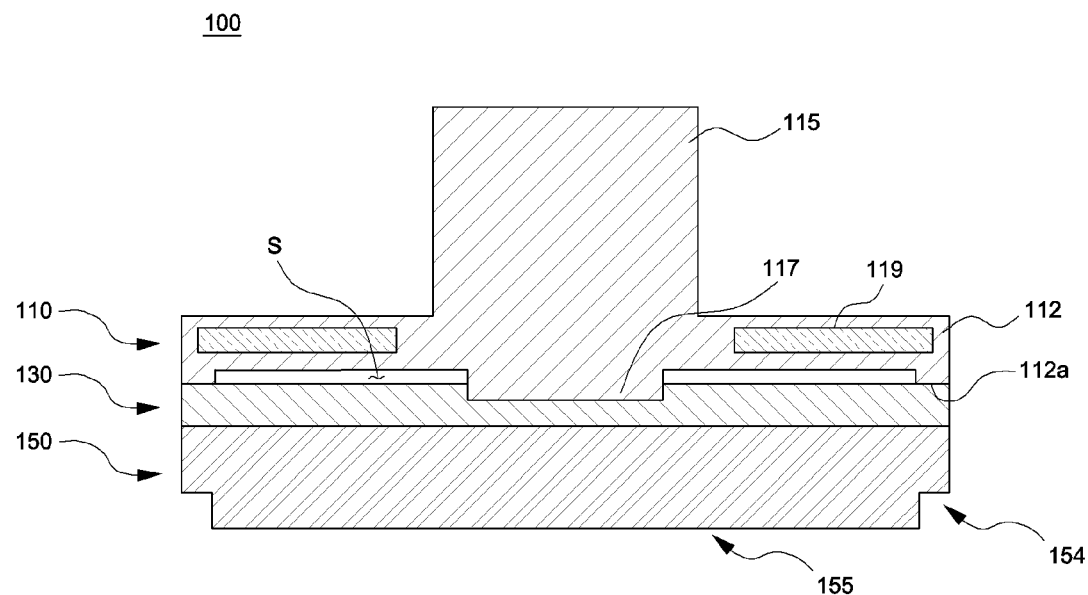
FIG. 2 is a side view illustrating a collet structure in accordance with an embodiment of the present disclosure.
Figure 3:
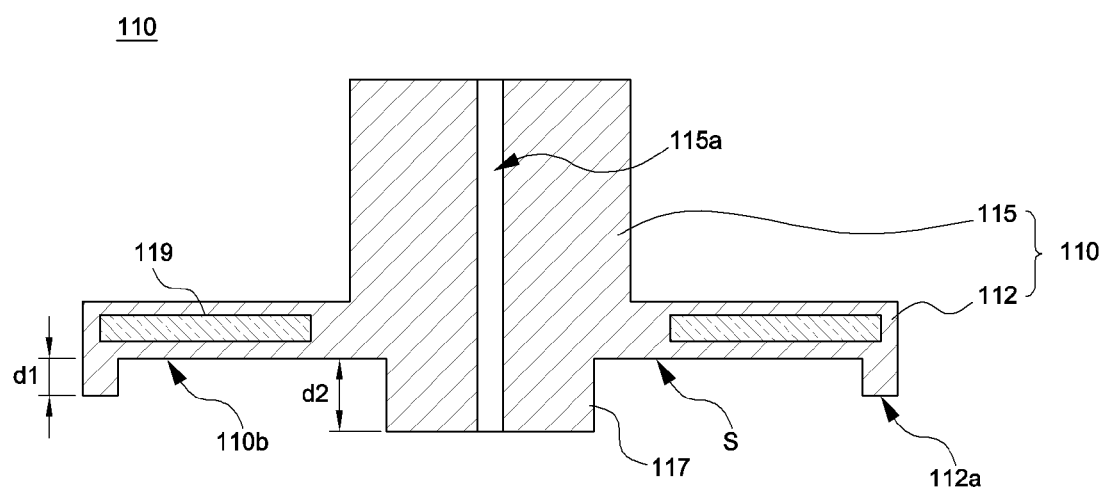
FIG. 3 is a cross-sectional view illustrating a holder of a collet structure in accordance with an embodiment of the present disclosure.

FIG. 1 is an exploded perspective view illustrating a collet structure in accordance with an embodiment of the present disclosure, FIG. 2 is a side view illustrating a collet structure in accordance with an embodiment of the present disclosure, and FIG. 3 is a cross-sectional view illustrating a holder of a collet structure in accordance with an embodiment of the present disclosure.

Referring to FIGS. 1 to 3, a collet structure 100 of a semiconductor fabricating apparatus in accordance with an embodiment may include a holder 110, a plate 130 and an absorption member 150.

The holder 110 may be configured to fix the plate 130 and the absorption member 150. For example, the plate 130 may be magnetically fixed to the holder 110. The holder 110 may have a size substantially equal to or less than a size of the plate 130. The holder 110 may include a shank 112 and a vacuum provider 115. The shank 112 and the vacuum provider 115 may be integrally formed with each other. The shank 112 and the vacuum provider 115 may be formed of the same or substantially the same material. The shank 112 may have a plate shape having a uniform thickness. The shank 112 may be configured to make contact with the plate 130. Thus, the shank 112 may have an area substantially equal to or less than an area of the plate 130.

The vacuum provider 115 may receive vacuum from an external device outside the holder 110. For example, the vacuum provider 115 may be positioned on a central portion of an upper surface of the shank 112. The vacuum provider 115 may include a first vacuum hole 115a formed in the vacuum provider 115. The first vacuum hole 115a may be extended to a bottom surface 110b of the holder 110 to transfer the vacuum to the plate 130 and the absorption member 150. Forming the shank 112 and the vacuum provider 115 of the holder 110 as an integral part from the same material is advantageous because it is not required to perform an additional process for aligning the shank 112 with the vacuum provider 115. In an embodiment, the shank 112 and the vacuum provider 115 may be formed of or include a non-conductive rubber, silicon, a urethane, and the like.

The shank 112 may include an edge contact 112a formed at an edge portion of a bottom surface of the shank 112. The edge contact 112a may have the shape of a rectangular protrusion having a first length d1 extending from the bottom surface 110b of the holder 110, in a side view. The edge contact 112a may be configured to make contact with the plate 130.

Figure 4A:
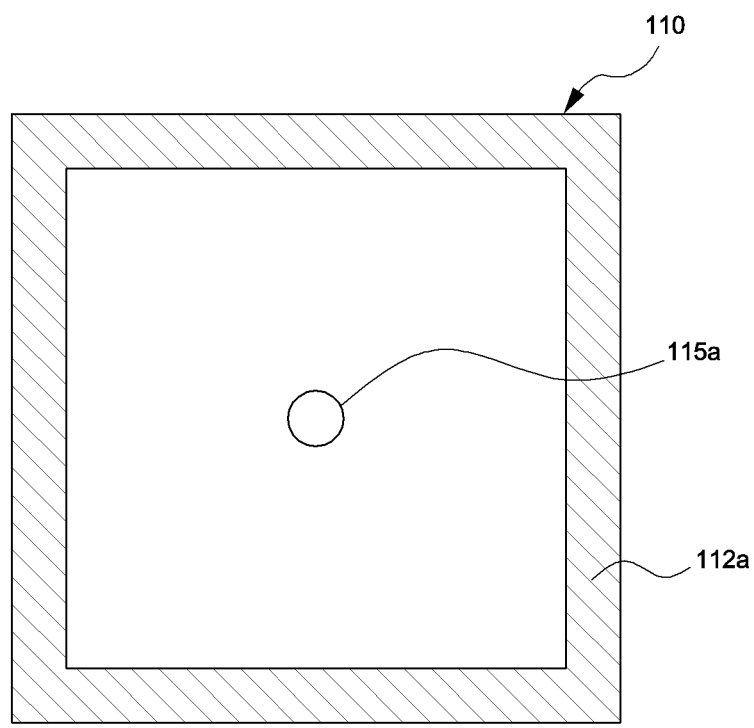
FIGS. 4A and 4B are bottom views illustrating a holder in accordance with embodiments of the present disclosure.
Figure 4B:
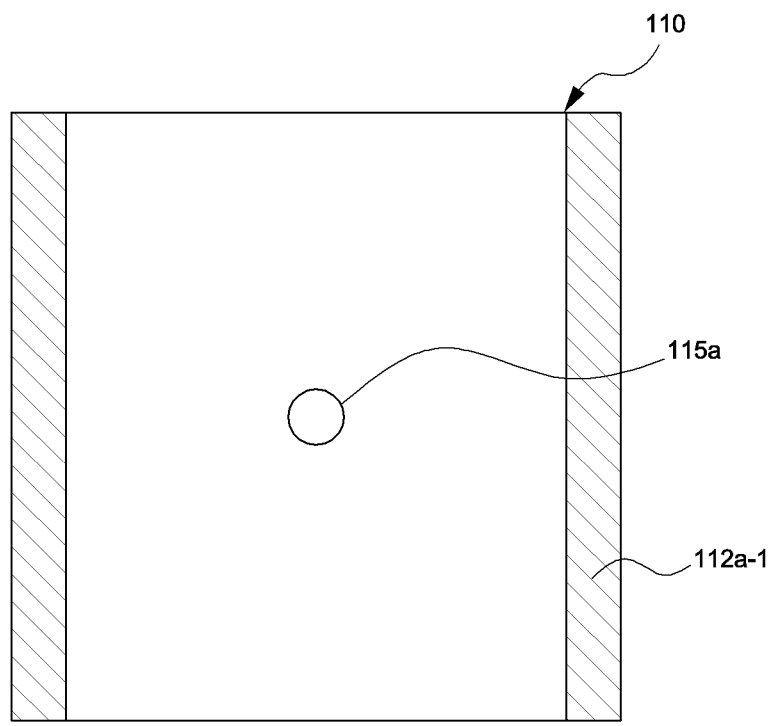

FIGS. 4A and 4B are bottom views illustrating a holder in accordance with embodiments of the present disclosure.

Referring to FIG. 4A, the edge contact 112a may have a frame shape configured to surround an edge portion of the bottom surface 110b of the holder 110. For example, a width of the edge contact 112a may be 1% to 10% of a width of the holder 110.

Alternatively, referring to FIG. 4B, an edge contact 112a-1 may be formed along a pair of opposite side surfaces of the bottom surface 110b of the holder 110. However, the edge contact 112a formed at the bottom surface of the holder 110 may have various shapes besides above-mentioned shapes.

Referring again to FIGS. 1 to 3, the holder 110 may further include an alignment block 117 used for mechanically combining the plate 130 with the holder 110. The alignment block 117 may be positioned on a central portion of the bottom surface 110b of the holder 110. The alignment block 117 may protrude by a second length d2 below the bottom surface 110b of the holder 110. The second length d2 may be longer than the first length d1. For example, the alignment block 117 may be located at a position corresponding to the vacuum provider 115. The alignment block 117 may have a diameter substantially equal to or less than a diameter of the vacuum provider 115. The first vacuum hole 115a may be extended to a bottom surface of the alignment block 117. In an embodiment, the alignment block 117 may be formed of or include a material substantially the same as the material of the shank 112 and the vacuum provider 115. In other words, the shank 112 and the vacuum provider 115 may form a single body. In an embodiment, one first vacuum hole 115a may be extended in the alignment block 117. In an embodiment, (not shown), the first vacuum hole 115a extended from the vacuum provider 115 may be branched into a plurality of vacuum lines in the alignment block 117.

The holder 110 may include at least one magnet 119. The magnet 119 may be arranged in the holder 110. The magnet 119 may be used for magnetically combining the holder 110 with the plate 130. In an embodiment, the magnet 119 may be formed of or include a material different from the material of the holder 110, i.e., the material of the shank 112, the vacuum provider 115 and the alignment block 117. In the illustrated embodiment, the at least one magnet 119 may have a plate shape and may be included only inside the shank 112 as shown in FIG. 3. The at least one magnet 119 may have various shapes.

FIGS. 5A to 5E are plan views illustrating arrangements of a magnet in accordance with embodiments of the present disclosure.

Figure 5A:
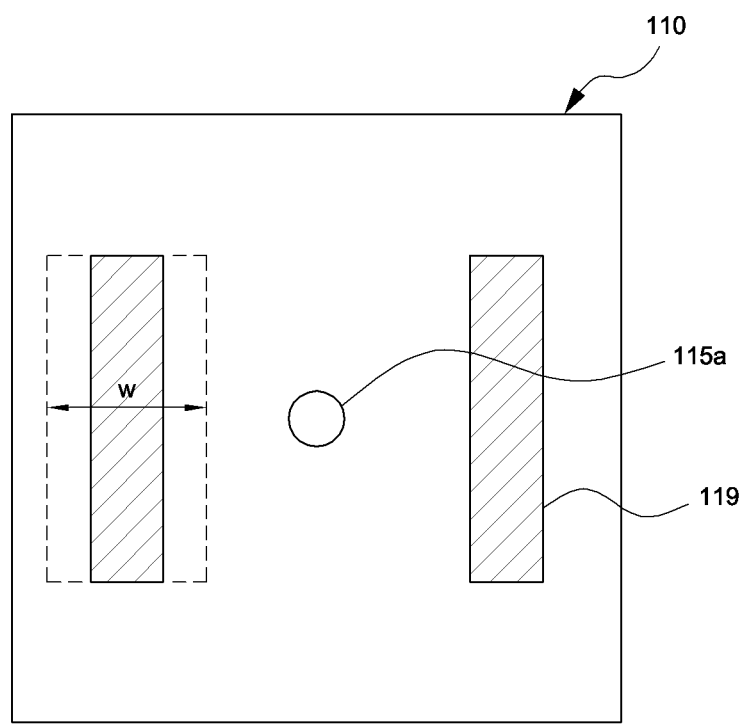
FIGS. 5A to 5E are plan views illustrating arrangements of a magnet in accordance with embodiments of the present disclosure.
Figure 5B:
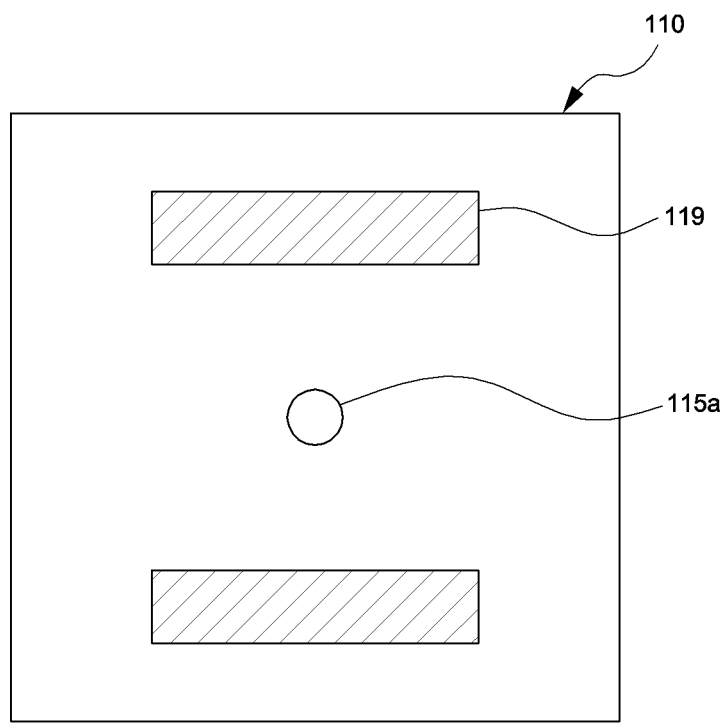
Figure 5C:
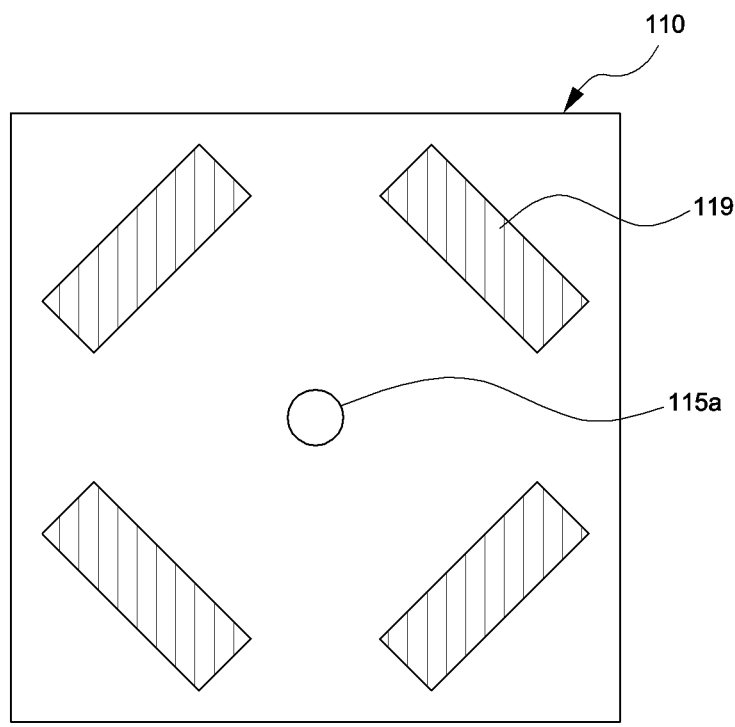
Figure 5D:
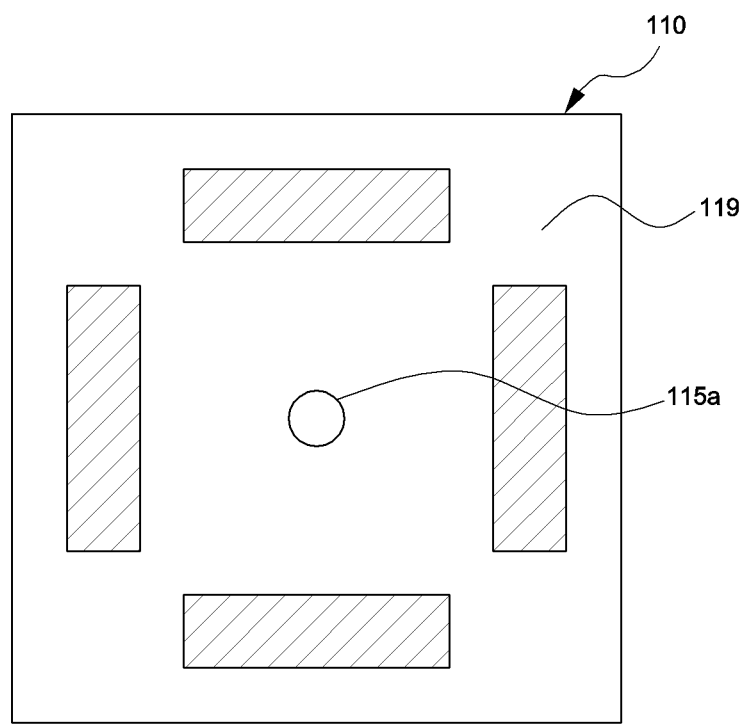
Figure 5E:
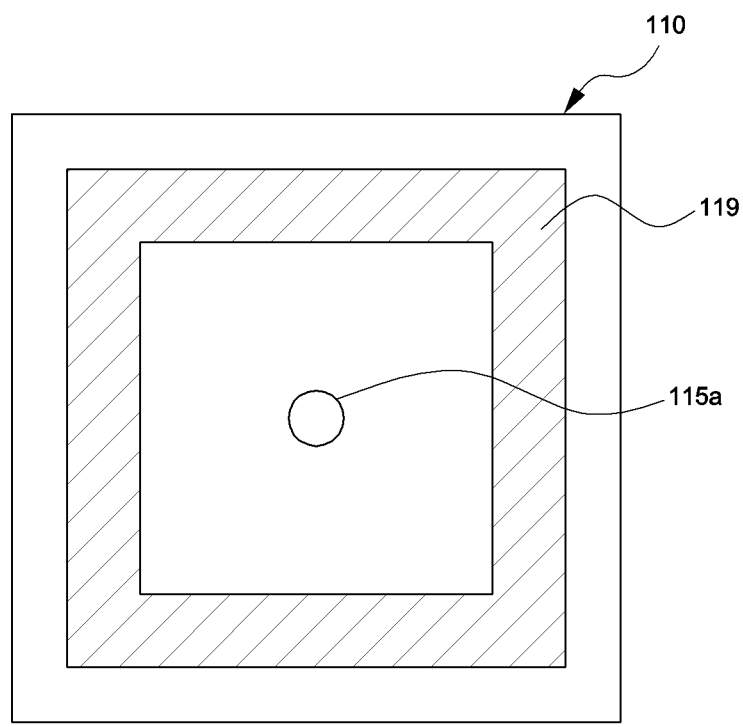

Referring to FIGS. 5A and 5B, the magnet 119 may be arranged along two strips parallel to each other positioned on opposite sides of the holder 110. The vacuum hole 115a may be centrally positioned between the opposite strips of the magnet 119. Referring to FIG. 5C, the magnet 119 may be arranged at two or four strips positioned at opposite corners of the holder 110 with the vacuum hole 115a positioned centrally between the opposite strips of the magnet 119. Referring to FIG. 5D, the magnet 119 may be arranged at four strips positioned at the four side surfaces of the holder 110, respectively. Referring to FIG. 5E, the magnet 119 may have a frame shape. The magnet 119 in the example of FIG. 5E has a rectangular shape, however, the invention may not be limited in shape. For example, in another embodiment, not shown, the magnet 119 may have a ring shape.

The magnet 119 in FIGS. 5A to 5E may have a width w which may vary in accordance with the sizes of the holder 110 and the plate 130.

The magnet 119 may include, for example, a neodymium permanent magnet, an electromagnet, a combination of a permanent magnet and an electromagnet, etc., not restricted within any specific type. That is, the magnet 119 may be formed of or include any suitable material providing a controllable magnetic force.

The holder 110 and the plate 130 may be combined with each other by the magnet 119 so that the plate 130 may be attached to the holder 110 without any slant.

Figure 6:
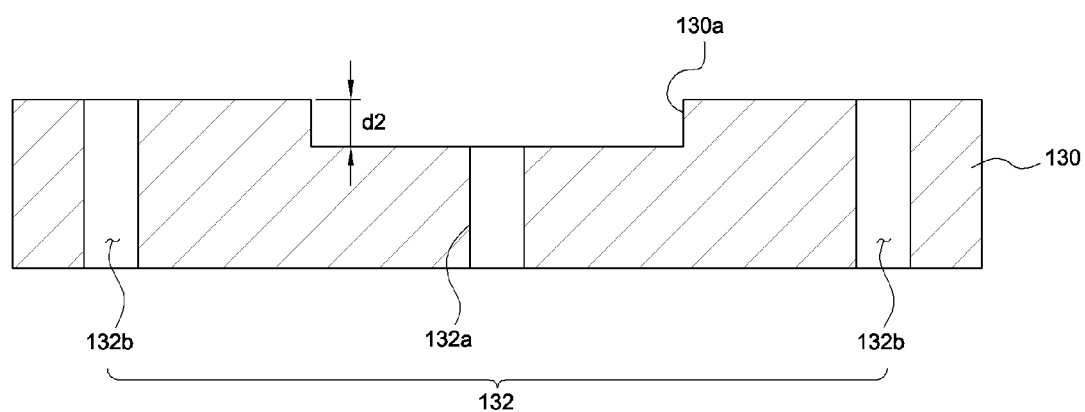
FIG. 6 is a cross-sectional view illustrating a plate in accordance with an embodiment of the present disclosure.
Figure 7A:
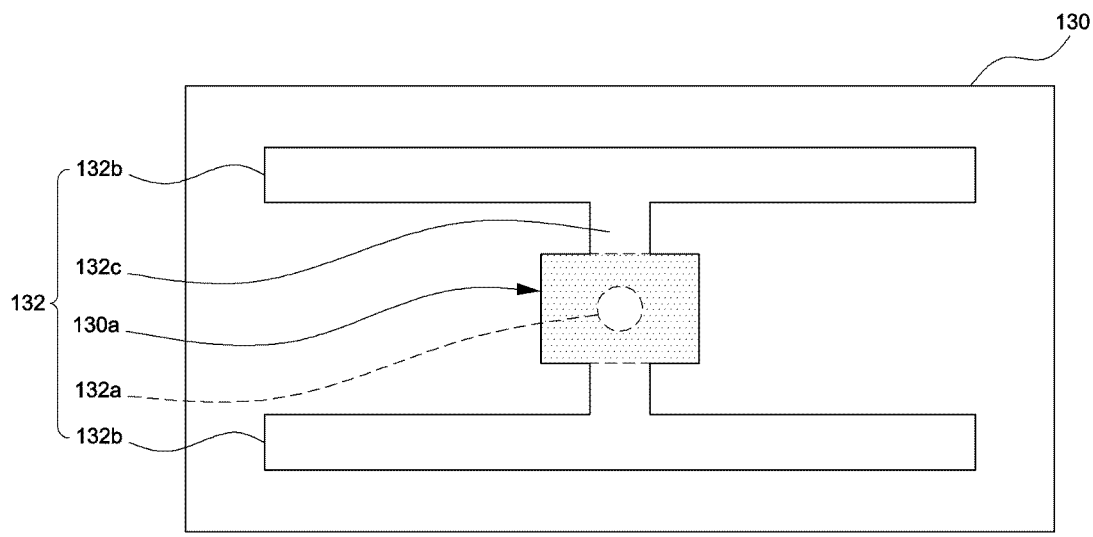
FIGS. 7A and 7B are top views illustrating a plate in accordance with embodiments of the present disclosure.
Figure 7B:
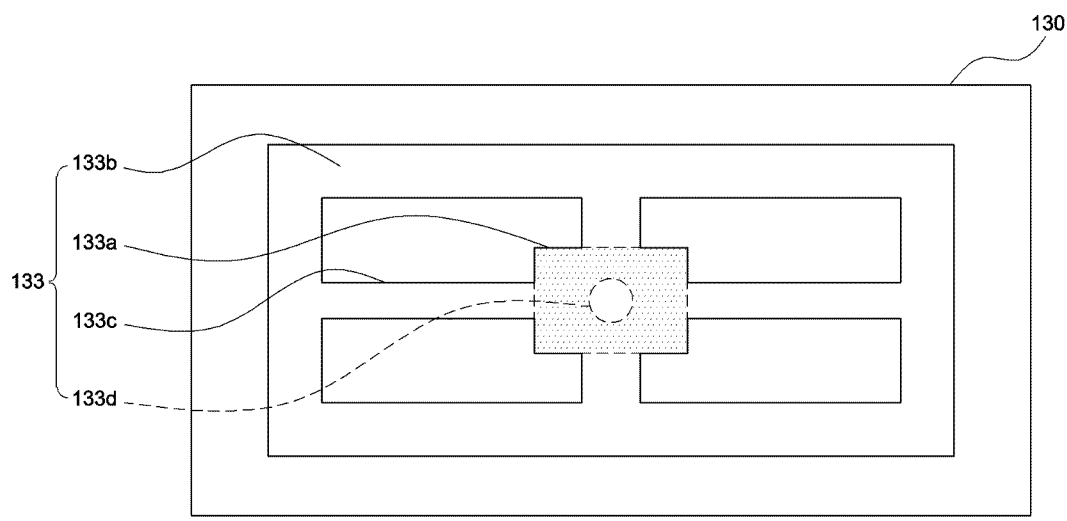

FIG. 6 is a cross-sectional view illustrating a plate in accordance with an embodiment of the present disclosure. FIGS. 7A and 7B are top views illustrating a plate in accordance with embodiments of the present disclosure.

Referring to FIGS. 1 to 7B, the plate 130 may include an alignment groove 130a configured to receive the alignment block 117. The alignment groove 130a may be formed at a central section of the top surface of the plate 130 that is positioned adjacent to the bottom surface of the holder 110. The alignment groove 130a may have a depth equal to or substantially equal to the second length d2. The plate 130 may be formed of or include a material magnetically combined with the holder 110 by the magnet 119. For example, the plate 130 may include a stainless component.

As mentioned above, when the plate 130 is attached to the holder 110, the edge contact 112a of the holder 110 may make contact with the upper surface of the plate 130. A space S may be formed between the edge contact 112a and the alignment block 117. The space S may function as a common vacuum space for absorbing the semiconductor chip during the vacuum provided from the vacuum provider 115.

The plate 130 may include a plurality of second vacuum holes 132 formed in the plate 130. The second vacuum holes 132 may be directly or indirectly connected to the first vacuum hole 115a to receive the vacuum.

As shown in FIG. 7A, the second vacuum holes 132 may include a center hole 132a, a line hole 132b and a connection hole 132c. The center hole 132a may be formed centrally within the alignment groove 130a and pass through the entire thickness of the plate 130. The center hole 132a may be located at a position aligning with the first vacuum hole 115a. Thus, the center hole 132a may be connected to the first vacuum hole 115a.

The line hole 132b may be extended along both long side surfaces of the plate 130 in parallel, with respect to the center hole 132a.

The connection hole 132c may extend between the line hole 132b and the alignment groove 130a to connect the line hole 132b and the alignment groove 130a. The vacuum supplied to the center hole 132a may be effectively transferred to the line hole 132b at the edge portion of the plate 130 through the connection hole 132c and the alignment groove 130a.

In another embodiment, as shown in FIG. 7B, a second vacuum hole 133 may include a center hole 133a, a line hole 133b and a connection hole 133c. The center hole 133a may be formed at a central portion of the plate 130. The line hole 133b may be formed along the edge portion of the plate 130. The connection hole 133c may be formed to connect the center hole 133a and the line hole 133b. The line hole 133b may have a rectangular frame shape configured to surround the four side surfaces of the rectangular plate 130. In this case, the four connection holes 133c may provide a connection between the center hole 133a and the four side surfaces of the rectangular frame.

Therefore, the vacuum supplied from the first vacuum hole 115a may be uniformly distributed to the plate 130 through the center hole 133a, the connection hole 133c and the line hole 133b.

Figure 8:
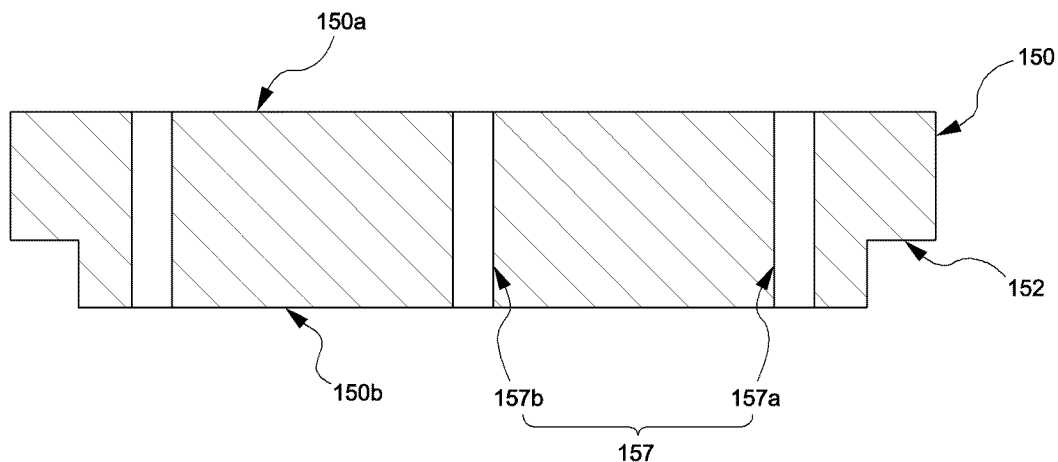
FIG. 8 is a cross-sectional view illustrating an absorption member in accordance with an embodiment of the present disclosure.
Figure 9:
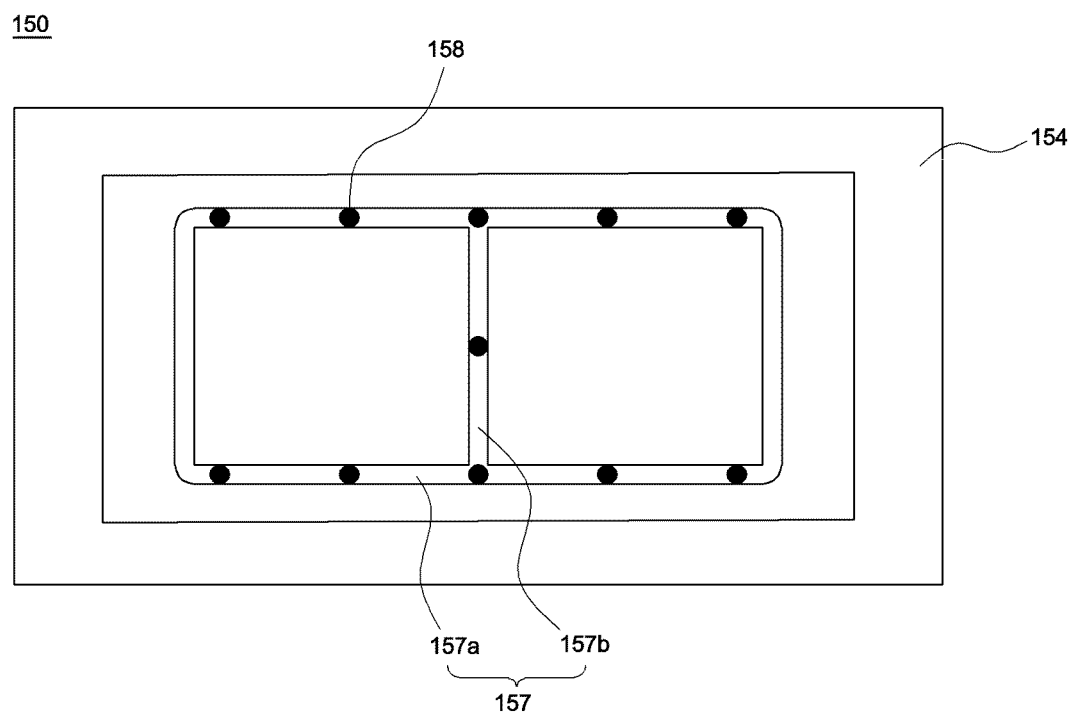
FIG. 9 is a plan view illustrating an absorption member in accordance with an embodiment of the present disclosure.

FIG. 8 is a cross-sectional view illustrating an absorption member in accordance with an embodiment of the present disclosure, and FIG. 9 is a plan view illustrating an absorption member in accordance with an embodiment of the present disclosure.

Referring to FIGS. 1 to 9, the absorption member 150 may include an upper surface 150a configured to make contact with the plate 130, and a bottom surface 150b facing a semiconductor chip (not shown). The absorption member 150 may be attached to the bottom surface of the plate 130 using: for example, an adhesive (not shown). The absorption member 150 may be formed of or include a resilient material for preventing the vacuum from being leaked through the absorption member 150. For example, the absorption member 150 may be formed of or include a rubber, silicon, and the like. Further, the absorption member 150 may include a conductive material for preventing generation of static electricity during the pick-up of the semiconductor chip. The absorption member 150 may have a thickness of about 3.5 mm to about 4 mm for minimizing an influence on other parts during the pick-up of the semiconductor chip.

A recess 154 may be formed at a lower corner of the absorption member 150. That is, the lower corner of the absorption member 150 may be removed to form the recess 154. The recess 154 may function to prevent a contact between the picked-up semiconductor chip and the adjacent semiconductor chip or a rail of the die bonding apparatus. The recess 154 may have a size changed in accordance with a size of the adjacent semiconductor chip, a size of the rail, etc. Further, when the absorption member 150 has a thin thickness, the absorption member 150 may not include the recess 154. For example, a sidewall of the recess 154 may correspond to an inner sidewall of the edge contact 112*a*.

The absorption member 150 may include a third vacuum hole 157. The third vacuum hole 157 may be connected to the second vacuum hole 132. The third vacuum hole 157 may be formed through the absorption member 150.

In various embodiments, the third vacuum hole 157 may include a first hole 157*a* and a second hole 157*b*. The first hole 157*a* may be configured to surround the absorption member 150. For example, the first hole 157*a* may have a frame shape. The second hole 157*b* may be configured to divide a space defined by the first hole 157*a*. For example, the first hole 157*a* may be connected to line holes 132*b* and 133*b* of the second vacuum holes 132 and 133. The first hole 157*a* may be formed at a position corresponding to the line holes 132*b* and 133*b* of the second vacuum holes 132 and 133. The second hole 157*b* may be connected to the center holes 132*a* and 133*a* and the connection holes 132*c* and 133*c* in the second vacuum holes 132 and 133.

The reference numeral 158 may indicate a tip formed at the third vacuum hole 157. The tip may be configured to make contact with the semiconductor chip. The tip may be formed of or include a rubber.

Figure 10:
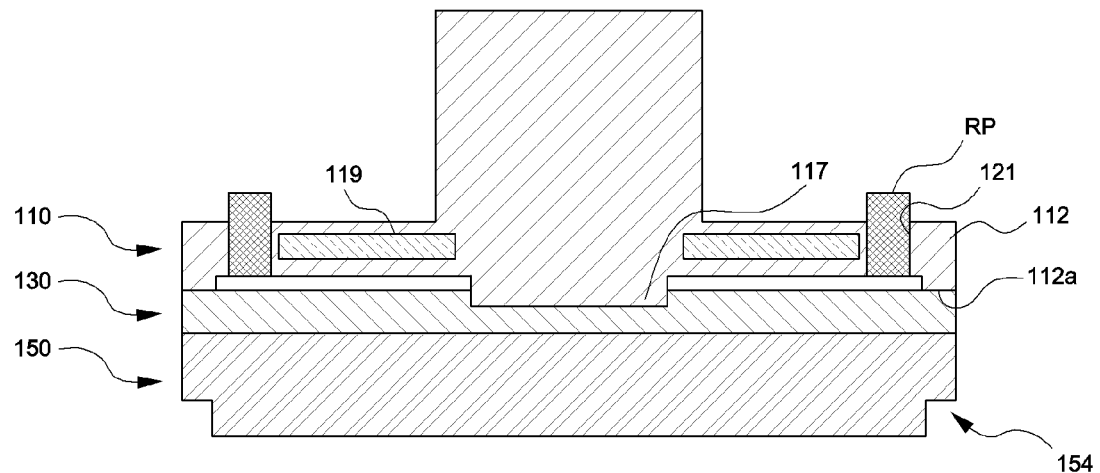
FIGS. 10 and 11 are cross-sectional views a method of dissembling a collet structure in accordance with embodiments of the present disclosure.
Figure 11:
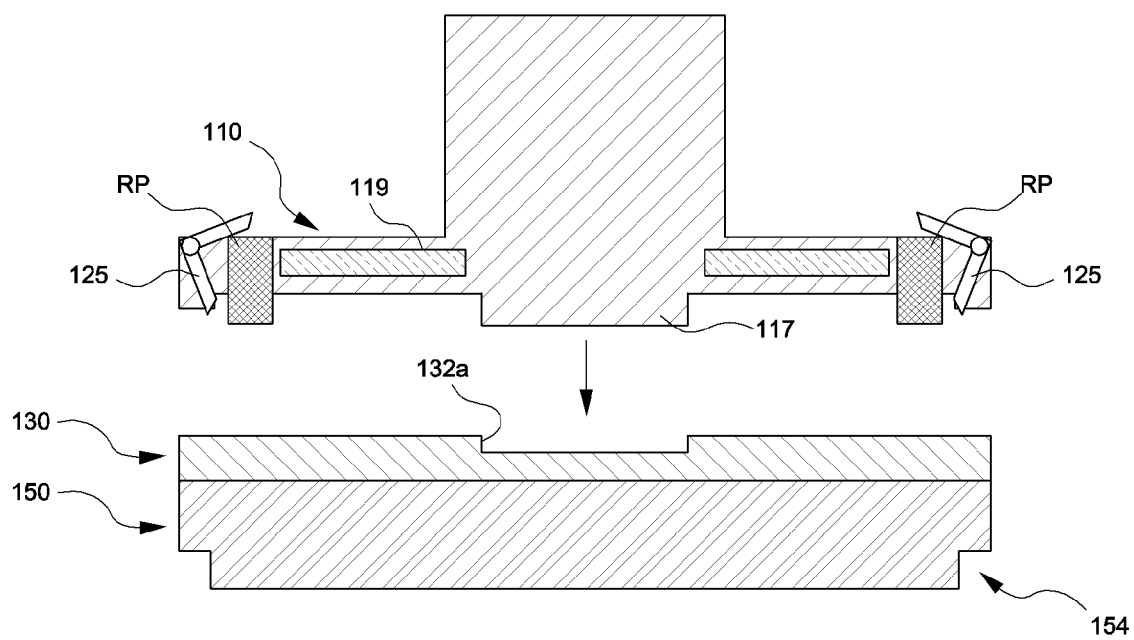

FIGS. 10 and 11 are cross-sectional views of a method of disassembling a collet structure in accordance with embodiments of the present disclosure.

Referring to FIGS. 10 and 11, a pin hole 121 may be formed at the shank 112. A removing pin RP may be inserted into the pin hole 121. The pin hole 121 may be formed at the edge portion of the shank 112 between the edge contact 112*a* and the magnet 119.

The pin hole 121 may be formed through the shank 112. The removing pin RP may have a length longer than a depth of the pin hole 121.

When the holder 110 is separated from the plate 130, the removing pin RP may be inserted into the pin hole 121. A latch 125 may be installed at the edge portion of the holder 110. A pressure may be applied to the removing pin RP using the latch 125 to separate the holder 110 from the plate 130.

Further, when the magnet 119 includes an electromagnet, the holder 110 may be more readily separated from the plate 130 by changing a magnetic force of the magnet 119. Alternatively, the holder 110 may be mechanically separated from the plate 130 using a mechanism such as a pneumatic cylinder.

Figure 12:
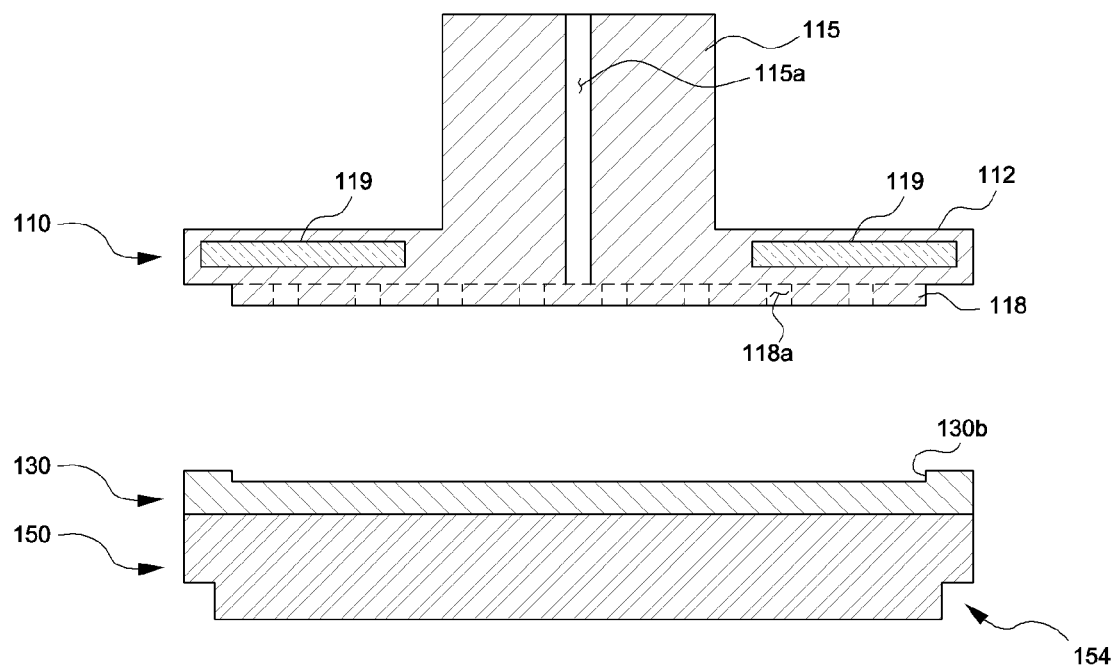
FIG. 12 is a cross-sectional view illustrating a collet structure in accordance with an embodiment of the present disclosure.

FIG. 12 is a cross-sectional view illustrating a collet structure in accordance with an embodiment of the present disclosure.

Referring to FIG. 12, the alignment block 118 may have a size larger than a size of the vacuum provider 115. For example, the size of the alignment block 118 may be overlapped with a part of the magnets 119 at both sides of the vacuum provider 115 as well as the vacuum provider 115. The alignment block 118 may be formed to extend along most of the region of the shank 112.

When the alignment block 118 occupies most of the region of the shank 112, a plurality of sub-vacuum holes 118*a* may be formed at the alignment block 118. The sub-vacuum holes 118*a* may be directly or indirectly connected to the first vacuum hole 115*a*. For example, the sub-vacuum holes 118*a* may be branched from the first vacuum hole 115*a*.

The plate 130 may include an alignment groove 130*b* configured to receive the alignment block 118. Thus, a side surface of the alignment block 118 and a side surface of the alignment groove 130*b* may be actual contact surfaces between the holder 110 and the plate 130.

Because the alignment groove 130*b* of the plate 130 may have an increased area, the number of the center holes may also be increased. For example, the number of the center holes in the alignment groove 130*b* may correspond to the numbers of the sub-vacuum holes 118*a*.

Figure 13:
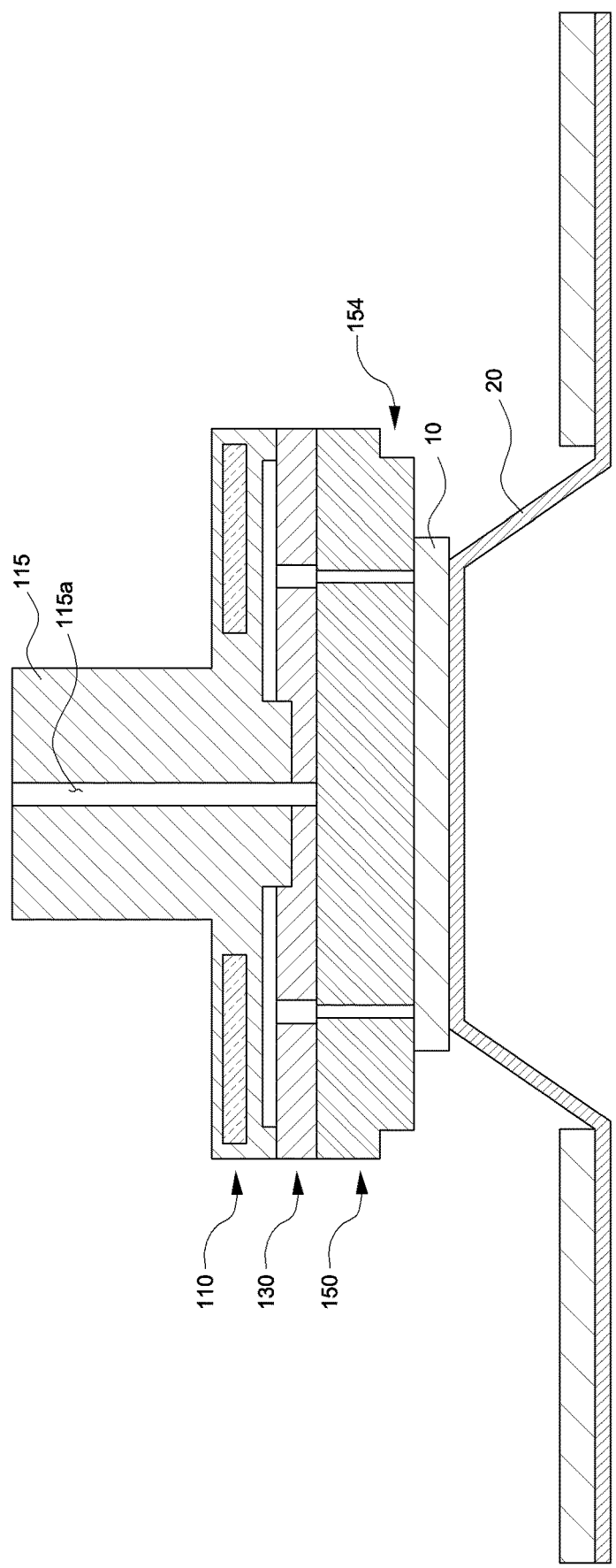
FIGS. 13 and 14 are cross-sectional views illustrating operations for picking-up a semiconductor chip by a collet structure in accordance with embodiments of the present disclosure.
Figure 14:
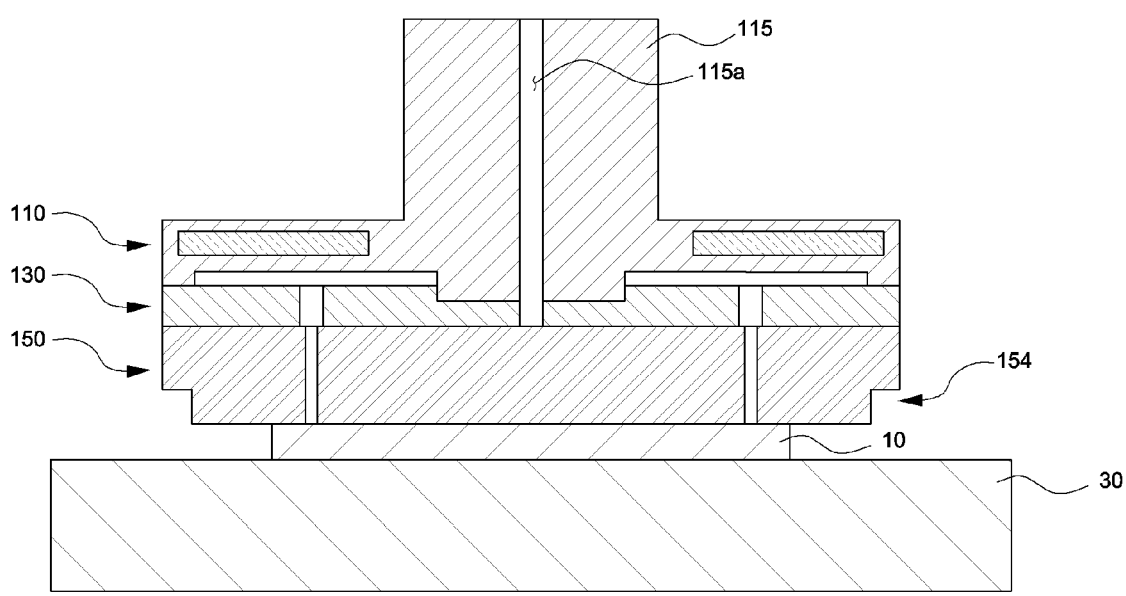

FIGS. 13 and 14 are cross-sectional views illustrating operations for picking-up a semiconductor chip by a collet structure in accordance with embodiments of the present disclosure.

Referring to FIGS. 13 and 14, the processes may be performed on the semiconductor substrate to form the plurality of the semiconductor chips 10. The semiconductor substrate may be cut along a scribe lane to singulate the semiconductor chips 10. The cut semiconductor chips 10 may be connected to each other using a tape.

The transferring apparatus may move the collet structure 100 over the semiconductor chip 10. The vacuum may then be applied to the collet structure 100. The vacuum may be supplied to the absorption member 150 through the first vacuum hole 115*a*, the second vacuum hole 132 and the third vacuum hole 157 to absorb the semiconductor chip 10 on the absorption member 150.

The absorption member 150 may have a sufficient thickness or the recess 154 may be formed a lower corner of the absorption member 150 so that a contact between the absorption member 150 and the adjacent semiconductor chip or the transferring apparatus such as the rail during the pick-up may be prevented. Further, because the holder 110 may be located over the plate 130, the holder 110 may not protrude from the side surface of the plate 130 to minimize the contact between the picked-up semiconductor chip and the parts of the transferring apparatus 200. Furthermore, because the holder 110 may make contact with the upper surface of the plate 130, the holder 110 may be configured to make contact with the plate 130 having various sizes to transfer the semiconductor chip having various sizes.

The semiconductor chip 10 absorbed on the collet structure 100 may be separated from the tape 20 by ejecting operation of the transferring apparatus 200.

The transferring apparatus 200 may attach the semiconductor chip 10 absorbed on the collet structure 100 to the upper surface of the package substrate 30. The transferring apparatus 200 may stop the supply of the vacuum to the collet structure 100 to complete the pick-up process and the transfer process of the collet structure 100.

According to various embodiments, the shank and a vacuum provider in the holder of the collet structure may be integrally formed with each other to omit an additional process for combining the vacuum provider with the shank. Further, the size of the holder may be substantially equal to or less than the size of the plate. Thus, the holder may make contact with the plates having various sizes to pick-up the semiconductor chips having various sizes. Furthermore, the semiconductor chip picked-up by the holder having a small size may not make contact with adjacent other semiconductor chips and/or parts. As a result, efficiency of a pick-up process, productivity of the semiconductor chip, etc., may be improved and a process error may also be prevented.

The above described embodiments of the present invention are intended to illustrate and not to limit the present invention. Various alternatives and equivalents are possible. The invention is not limited by the embodiments described herein. Nor is the invention limited to any specific type of semiconductor device. Other additions, subtractions, or modifications which are obvious in view of the present disclosure are intended to fall within the scope of the appended claims.

What is claimed is:

1. A semiconductor fabricating apparatus including a collet structure configured to pick-up a semiconductor chip, the collet structure comprising:
   a holder configured to receive a vacuum, the holder including a magnet arranged in the holder;
   a plate including an upper surface magnetically and mechanically combined with the holder; and
   an absorption member configured to make contact with the plate to pick-up the semiconductor chip using the vacuum provided from the plate,
   wherein the holder comprises:
   a shank disposed with the plate to match entire sidewalls of the shank to entire sidewalls of the plate;
   a vacuum provider arranged over the shank, the vacuum provider including a first vacuum hole configured to transfer the vacuum; and
   an edge contact configured to protrude from a bottom edge of the shank towards the plate by a first length, and
   wherein a bottom surface of the edge contact is contacted with entire upper edges of the plate.

2. The semiconductor fabricating apparatus of claim 1, wherein the shank and the vacuum provider are composed of one body, and
   wherein a bottom surface of the shank located under the vacuum provider is in contact with the upper surface of the plate.

3. The semiconductor fabricating apparatus of claim 1, wherein the shank further comprises an alignment block protruded from a bottom surface of the shank to be combined with the upper surface of the plate, and wherein the alignment block has a second length longer than the first length.

4. The semiconductor fabricating apparatus of claim 3, wherein the alignment block comprises a material being the same as a material of the shank and the vacuum provider.

5. The semiconductor fabricating apparatus of claim 3, wherein the first vacuum hole is extended to a bottom surface of the alignment block.

6. The semiconductor fabricating apparatus of claim 3, wherein the alignment block has a width equal to or less than a width of the vacuum provider.

7. The semiconductor fabricating apparatus of claim 3, wherein the plate comprises:
   an alignment groove formed at the upper surface of the plate to receive the alignment block; and
   a plurality of second vacuum holes connected to the first vacuum hole.

8. The semiconductor fabricating apparatus of claim 7, wherein each of the second vacuum holes comprises:
   at least one center hole connected to the alignment groove;
   a line hole formed at an edge portion of the plate; and
   a connection hole connected between the center hole and the line hole.

9. The semiconductor fabricating apparatus of claim 1, wherein the absorption member comprises a recess formed at a lower corner of the absorption member to have a width of the recess narrower than a width of an upper region in the absorption member.

10. The semiconductor fabricating apparatus of claim 9, wherein the recess has an outer sidewall corresponding to an inner sidewall of the edge contact.

11. The semiconductor fabricating apparatus of claim 10, wherein the absorption member further comprises a plurality of third vacuum holes connected to a second vacuum hole formed in the plate.

12. The semiconductor fabricating apparatus of claim 11, wherein the absorption member has a thickness of 3.5 mm to 4 mm.

* * * * *